United States Patent
Dalton (10) Patent No.: US 9,788,447 B2
(45) Date of Patent: Oct. 10, 2017

(54) MOUNTING ARRANGEMENT

(71) Applicant: ROLLS-ROYCE PLC, London (GB)

(72) Inventor: Justin Sean Dalton, Derby (GB)

(73) Assignee: ROLLS-ROYCE plc, London (GB)

( * ) Notice: Subject to any disclaimer, the term of this patent is extended or adjusted under 35 U.S.C. 154(b) by 654 days.

(21) Appl. No.: 14/193,335

(22) Filed: Feb. 28, 2014

(65) Prior Publication Data

US 2014/0290271 A1 Oct. 2, 2014

(30) Foreign Application Priority Data

Mar. 28, 2013 (GB) .................................. 1305723.7

(51) Int. Cl.
*H05K 7/14* (2006.01)
*F02C 7/32* (2006.01)
(Continued)

(52) U.S. Cl.
CPC ............. *H05K 7/14* (2013.01); *F01D 21/045* (2013.01); *F01D 21/14* (2013.01); *F02C 7/32* (2013.01); *F05D 2230/80* (2013.01); *F05D 2240/90* (2013.01); *F05D 2260/311* (2013.01); *F05D 2260/94* (2013.01); *F05D 2300/432* (2013.01); *F05D 2300/434* (2013.01);
(Continued)

(58) Field of Classification Search
CPC .. B60R 16/0207; B60R 16/0215; H02G 3/02; H02G 3/04; Y10T 29/49947; Y10T 29/4932; Y10T 29/4998; Y10T 29/49982; Y10T 29/49948; Y10T 29/49158; F01D 21/14; F02C 7/32; F05D 2230/80; F05D 2240/90; F05D 2260/311; F05D 2260/941; F05D 2300/603; H05K 7/14
See application file for complete search history.

(56) References Cited

U.S. PATENT DOCUMENTS 4,119,794 A * 10/1978 Matsuki .................... B32B 3/28
174/68.1
5,705,104 A * 1/1998 Trublowski ......... B60R 16/0207
264/1.25
(Continued)

FOREIGN PATENT DOCUMENTS

EP 1 010 879 A2 6/2000
GB 2463867 A * 3/2010 ......... B60R 16/0207
(Continued)

OTHER PUBLICATIONS

Search Report issued in British Application No. 1305723.7 dated Sep. 26, 2013.
(Continued)

*Primary Examiner* — Jermie Cozart
(74) *Attorney, Agent, or Firm* — Oliff PLC (57) ABSTRACT

A rigid electrical raft is provided to a gas turbine engine via a fusible mount arrangement. The rigid electrical raft may be a part of an electrical system of the gas turbine engine, for example a part of the electrical harness. The fusible mount is arranged to break when a predetermined load is applied. The rigid electrical raft may be attached to a fan case of the engine, and the predetermined load may be that which results from a fan blade being released from the hub. This ensures that the rigid electrical raft is protected from the load.

15 Claims, 7 Drawing Sheets

(51) Int. Cl.
*F01D 21/04* (2006.01)
*F01D 21/14* (2006.01)

(52) U.S. Cl.
CPC ....... *F05D 2300/436* (2013.01); *Y02T 50/672* (2013.01); *Y10T 29/4998* (2015.01); *Y10T 29/49117* (2015.01); *Y10T 29/49982* (2015.01)

(56) References Cited

U.S. PATENT DOCUMENTS

| | | | | |
|---|---|---|---|---|
| 6,107,569 | A * | 8/2000 | Shields | B60R 16/0215 174/110 F |
| 6,126,228 | A * | 10/2000 | Davis, Jr. | B60R 16/0222 174/72 A |
| 6,582,013 | B1 * | 6/2003 | Inoue | B62D 25/06 296/214 |
| 8,284,534 | B2 * | 10/2012 | Guillot | H03K 17/0822 361/93.1 |
| 8,733,828 | B2 * | 5/2014 | VanHouten | B60R 13/0212 296/210 |
| 9,054,474 | B2 * | 6/2015 | Omori | B60R 16/0207 |
| 9,253,870 | B2 * | 2/2016 | Willmot | H05K 1/0201 |
| 9,340,166 | B2 * | 5/2016 | VanHouten | B60R 13/0212 |
| 9,456,472 | B2 * | 9/2016 | Dalton | F02C 7/12 |
| 2002/0049002 | A1* | 4/2002 | Higashida | H01R 13/60 439/677 |
| 2005/0130460 | A1 | 6/2005 | Kiyota et al. | |
| 2005/0257956 | A1* | 11/2005 | Marshall | B29C 35/0272 174/260 |
| 2006/0243870 | A1 | 11/2006 | Ishiguro et al. | |
| 2007/0125087 | A1 | 6/2007 | Callaghan | |
| 2011/0267728 | A1* | 11/2011 | Guillot | H03K 17/0822 361/87 |
| 2012/0228024 | A1* | 9/2012 | Omori | B60R 16/0207 174/72 A |
| 2013/0189868 | A1* | 7/2013 | Fitt | H01R 13/518 439/272 |
| 2014/0050571 | A1* | 2/2014 | Sauerhoefer | F01D 25/243 415/182.1 |
| 2014/0208770 | A1* | 7/2014 | Fitt | F16B 37/122 60/801 |
| 2014/0305136 | A1* | 10/2014 | Taylor | F02C 7/32 60/801 |
| 2014/0327299 | A1* | 11/2014 | Broughton | F02C 7/00 307/9.1 |
| 2014/0328030 | A1* | 11/2014 | Broughton | F02C 7/32 361/749 |
| 2015/0053663 | A1* | 2/2015 | Sakota | B64C 1/12 219/202 |
| 2015/0342022 | A1* | 11/2015 | Willmot | H05K 1/0201 174/250 |
| 2016/0056578 | A1* | 2/2016 | Taylor | H01R 13/648 439/535 |
| 2016/0057873 | A1* | 2/2016 | Richardson | G01R 29/0835 324/627 |
| 2016/0069213 | A1* | 3/2016 | Fitt | F01D 25/24 415/121.3 |
| 2016/0072210 | A1* | 3/2016 | Armstrong | H05K 3/363 439/67 |

FOREIGN PATENT DOCUMENTS

| | | | | |
|---|---|---|---|---|
| GB | | 2497807 A | 6/2013 | |
| GB | EP | 2607651 A2 * | 6/2013 | ............... F02C 7/12 |
| GB | EP | 2607653 A2 * | 6/2013 | ............... F02C 7/12 |
| GB | | 2498006 A * | 7/2013 | ............... F02C 7/12 |
| GB | | 2498014 A * | 7/2013 | ............... F02C 7/12 |
| JP | A-2007-290435 | | 11/2007 | |
| WO | 2014/081500 A2 | | 5/2014 | |

OTHER PUBLICATIONS

Apr. 22, 2015 Search Report issued in European Application No. 14 15 7135.

* cited by examiner

Fig. 1

(PRIOR ART)

MOUNTING ARRANGEMENT

CROSS-REFERENCE TO RELATED APPLICATIONS

This application is based upon and claims the benefit of priority from British Patent Application Number GB1305723.7 filed 28 Mar. 2013, the entire contents of which are incorporated by reference.

BACKGROUND OF THE INVENTION

1. Field of the Disclosure

The disclosure relates to a mounting arrangement, in particular to a mounting arrangement for mounting an electrical raft component to a gas turbine engine.

2. Description of the Related Art

A typical gas turbine engine has a substantial number of electrical components which serve, for example, to sense operating parameters of the engine and/or to control actuators which operate devices in the engine. Such devices may, for example, control fuel flow, variable vanes and air bleed valves. The actuators may themselves be electrically powered, although some may be pneumatically or hydraulically powered, but controlled by electrical signals.

Electrical power, and signals to and from the individual electrical components, is commonly transmitted along conductors. Conventionally, such conductors may be in the form of wires and/or cables which are assembled together in a harness. In such a conventional harness, each wire may be surrounded by an insulating sleeve, which may be braided or have a braided cover.

Figure 1:
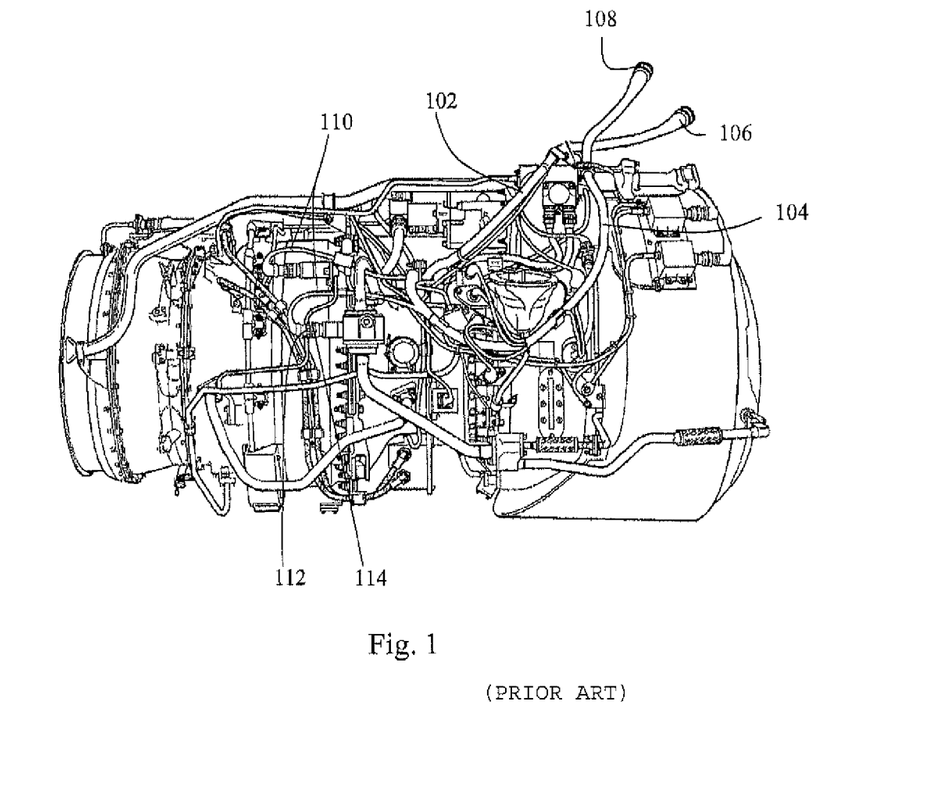
FIG. 1 shows a gas turbine engine with a conventional harness.

By way of example, FIG. 1 of the accompanying drawings shows a typical gas turbine engine including two conventional wiring harnesses 102, 104, each provided with a respective connector component 106, 108 for connection to circuitry, which may be for example accommodated within the airframe of an aircraft in which the engine is installed.

The harnesses 102, 104 are assembled from individual wires and cables which are held together over at least part of their lengths by suitable sleeving and/or braiding. Individual wires and cables, for example those indicated at 110, emerge from the sleeving or braiding to terminate at plug or socket connector components 112 for cooperation with complementary socket or plug connector components 114 on, or connected to, the respective electrical components.

Each conventional harness 102, 104 comprises a multitude of insulated wires and cables. This makes the conventional harness itself bulky, heavy and difficult to manipulate. The conventional harnesses occupy significant space within a gas turbine engine (for example within the nacelle of a gas turbine engine), and thus may compromise the design of the aircraft, for example the size and/or weight and/or shape of the nacelle.

Conventional harnesses comprise a large number of components, including various individual wires and/or bundles of wires, supporting components (such as brackets or cables) and electrical and/or mechanical connectors. This can make the assembly process complicated (and thus susceptible to errors) and/or time consuming. Disassembly of the conventional harnesses (for example removal of the conventional harnesses from a gas turbine engine during maintenance) may also be complicated and/or time consuming. Thus, in many maintenance (or repair or overhaul) procedures on a gas turbine engine, removal and subsequent refitting of the conventional electrical harness may account for a very significant portion of the operation time and/or account for a significant proportion of the potential assembly errors.

The electrical conductors in the conventional harnesses may be susceptible to mechanical damage. For example, mechanical damage may occur during installation (for example through accidental piercing of the protective sleeves/braiding) and/or during service (for example due to vibration). In order to reduce the likelihood of damage to the conductors in a conventional harness, the protective sleeves/braiding may need to be further reinforced, adding still further weight and reducing the ease with which they can be manipulated. Similarly, the exposed electrical connectors used to connect one conductor to another conductor or conductors to electrical units may be susceptible to damage and/or may add significant weight to the engine.

An electrical system of a gas turbine engine must be capable of continued operation in the event of certain types of failure elsewhere in the engine. For example, the electrical system must not fail (or at least critical parts of the electrical system must not fail) in the event of a fan blade being released from the engine (a so-called "fan-blade off, or FBO, event).

OBJECTS AND SUMMARY

An object is to address at least one of the drawbacks associated with conventional harnesses, whilst maintaining or improving the ability of the electrical system to withstand failures (such as mechanical failures) elsewhere in the engine.

According to an aspect, there is provided an assembly comprising a rigid electrical raft mounted to a body. The rigid electrical raft comprises electrical conductors embedded in a rigid material. The rigid electrical raft is mechanically attached to the body using at least one fusible mount arrangement. The fusible mount arrangement is constructed and arranged to break (or fuse) when a predetermined load is applied to the assembly (for example to the body of the assembly).

After a load at least as large as the predetermined load has been applied to the assembly, the rigid electrical raft and the body may thus no longer be attached through the fusible mount arrangement. The predetermined load may be applied to the fusible mount arrangement from the body. Thus, the or each fusible mount arrangement may prevent the full predetermined load being passed to the rigid electrical raft. The fusible mount arrangement may limit (for example provide an upper limit on) the load that is passed to the rigid electrical raft. The assembly may comprise one fusible mount arrangement or more than one fusible mount arrangement, such as two, three, four, five or more than five fusible mount arrangements.

The predetermined load may be a predetermined impact and/or impulse. For example, the predetermined load may be provided by an impact on the body.

The assembly provides protection to the rigid electrical raft from the predetermined load (and/or from the event that caused the predetermined load), for example by provision of the fusible mount arrangement. This may ensure that the rigid electrical raft continues to operate in the intended manner (for example remains substantially undamaged) in the event of the assembly (for example the body) being exposed to a load that is at least equal to a predetermined load.

The body to which the rigid electrical raft is attached may be a part of a gas turbine engine. The rigid electrical raft may be at least a part of an electrical harness of the gas turbine engine, and thus may be referred to as an electrical harness raft. Thus, at least a part (for example all) of a conventional electrical harness of a gas turbine engine may be replaced with one or more electrical rafts, at least one of which may have be attached to the gas turbine engine using a fusible mount arrangement.

The predetermined load at which the fusible mount arrangement breaks may be set such that the fusible mount arrangement, in whatever form it takes, is strong enough to survive the loads generated during normal usage (such as during manufacture/assembly and in service), but sufficiently weak that it breaks when the predetermined load is reached, for example as a result of a failure (for example failure of another component).

Purely by way of example, the fusible mount arrangement may be arranged to survive loads that are at least in the range of from 5% to 50%, for example 10% to 40%, for example 20% to 25% greater than the expected load during normal operation. Purely by way of example, the fusible mount arrangement may be arranged to break when loads that are in the range of from 5% to 50%, for example 10% to 40%, for example 20% to 25% less than the expected load during a failure event (for example, a fan-blade-off event when the rigid electrical raft is attached to a fan case, as described elsewhere herein) are applied to the assembly. Of course, the precise loads and safety factor margins that are used to determine the predetermined load at which the fusible mount fails may be determined by the precise application, including, for example, the expected difference between the loads experienced during normal use and the loads experienced as a result of a failure.

Accordingly, there is provided a gas turbine engine comprising the assembly including a rigid electrical raft mounted to a body using at least one fusible mount arrangement. The assembly may be, for example, as described herein.

According to an aspect, there is provided a method of assembling a gas turbine engine having a rigid electrical raft comprising electrical conductors embedded in a rigid material. The method comprises mechanically attaching the rigid electrical raft to the gas turbine engine (for example to a fan containment structure thereof) using at least one fusible mount arrangement that is constructed and arranged to break when a predetermined load is applied to the part of the gas turbine engine to which the rigid electrical raft is attached (for example to the fan containment structure).

In general, use of one or more rigid electrical rafts having electrical conductors embedded in a rigid material may significantly reduce build time of an engine. For example, use of rigid electrical rafts (which may be referred to herein simply as electrical rafts) may significantly reduce the part count involved in engine assembly compared with a conventional harness arrangement. The number and/or complexity of the operations required to assemble an engine (for example to assemble/install the electrical system (or network) and/or other peripheral components, which may be referred to in general as engine dressing) may be reduced. For example, rather than having to install/assemble a great number of wires and/or wiring looms together on the engine installation, it may only be necessary to attach a relatively small number of rigid electrical rafts/rigid electrical raft assemblies, which themselves may be straightforward to handle, position, secure and connect. Thus, use of rigid electrical rafts in a gas turbine installation may reduce assembly time and/or reduce the possibility of errors occurring during assembly.

Use of electrical rafts may provide significant advantages during maintenance, such as repair and overhaul. As discussed above, the electrical rafts may be particularly quick and straightforward to assemble. The same advantages discussed above in relation to assembly apply to disassembly/removal from the gas turbine engine. Thus, any repair/overhaul that requires removal of at least a part of the electrical harness may be simplified and/or speeded up through use of electrical rafts as at least a part of the electrical harness, for example compared with conventional harnesses. Use of electrical rafts (for example as part of one or more electrical raft assemblies) may allow maintenance procedures to be advantageously adapted. For example, some maintenance procedures may only require access to a certain portion of the gas turbine engine that only requires a part of the harness to be removed. It may be difficult and/or time consuming, or not even possible, to only remove the required part of a conventional harness from a gas turbine engine. However, it may be relatively straightforward to only remove the relevant electrical raft, for example by simply disconnecting it from the engine and any other electrical rafts/components to which it is connected. Decreasing maintenance times has the advantage of, for example, reducing out-of service times (for example off-wing times for engines that are used on aircraft).

The build/assembly times may be additionally or alternatively reduced by pre-assembling and/or pre-testing individual and/or combinations of electrical rafts and/or electrical raft assemblies prior to engine assembly. This may allow the electrical and/or mechanical operation of the electrical rafts to be proven before installation, thereby reducing/eliminating the testing required during engine installation.

The electrical rafts/electrical raft assemblies may be a particularly lightweight solution for transferring electrical signals around an engine. For example, an electrical raft may be lighter, for example significantly lighter, than a conventional harness required to transmit a given number of electrical signals. A plurality of conductors may be embedded in a single electrical raft, whereas in a conventional arrangement a large number of heavy, bulky wires, usually with insulating sleeves, would be required. The reduced weight may be particularly advantageous, for example, when used on gas turbine engines on aircraft.

Electrical rafts may be more easily packaged and/or more compact, for example than conventional harnesses. The electrical rafts can be made into a very wide range of shapes as desired. This may be achieved, for example, by manufacturing the electrical rafts using a mould conforming to the desired shape. As such, each electrical raft may be shaped, for example, to turn through a tighter corner (or smaller bend radius) than a conventional harness. The electrical rafts may thus provide a particularly compact solution for transferring electrical signals around a gas turbine engine. The electrical rafts may be readily shaped to conform to neighbouring components/regions of a gas turbine engine, for example components/regions to which the particular electrical raft assembly is attached, such as a fan casing or a core casing.

The electrical raft(s) may provide improved protection to the electrical conductors during manufacture/assembly of the raft/gas turbine installation, and/or during service/operation/maintenance of the gas turbine engine. This may result in lower maintenance costs, for example due to fewer damaged components requiring replacement/repair and/or due to the possibility of extending time intervals (or service intervals) between inspecting the electrical system, for example compared with a system using only conventional harnesses.

The body to which the rigid electrical raft is attached may be a fan containment structure of a gas turbine engine that comprises fan blades. For example, the body may be a fan case, which may be referred to as a fan containment case. The predetermined load at which the fusible mount arrangement is constructed and arranged to break may be lower than (or equal to) the load generated (or expected to be generated) in the event of a fan blade being released from the gas turbine engine and striking the fan containment structure. The predetermined load at which the fusible mount arrangement is constructed and arranged to break may be higher than the bad generated (or expected to be generated) in normal operation of the engine.

For example, the predetermined load (or impulse) may be less than or equal to that which is expected to result from a FBO event. For example, the predetermined load may be less than or equal to that which is expected to be experienced by a fan containment case as a result of a FBO event, and/or the load that is passed to the fusible mount arrangement as a result of a FBO event. The expected load generated as a result of a FBO event may be determined by experiment and/or simulation, for example.

Thus, the fusible mount arrangement may break as a result of a FBO event so as to limit the load or force that is transmitted to the rigid electrical raft.

The embedded electrical conductors in the rigid electrical raft may be a part of an electrical system of the gas turbine engine. The rigid electrical raft may have embedded therein or mounted thereon at least one of: another part of the electrical system, and a part of another system of the gas turbine engine. This may still further simplify the gas turbine engine and the assembly thereof and/or reduce the part count of the engine. A surface of a rigid electrical raft may be used as a mounting surface for other gas turbine engine components/systems, such as ancillary/auxiliary components/systems.

For example, the rigid electrical raft may also comprise an electrical unit, or ECU, such as an Electronic Engine Controller (EEC) and/or an Engine Health Monitoring Unit (EMU). Thus, a surface of a rigid electrical raft may be used as a mounting surface for other gas turbine engine components/systems, such as ancillary/auxiliary components/systems.

Additionally or alternatively, the rigid electrical raft (and thus the assembly) may comprise at least a part of a fluid system, such as one or more fluid passages. Such a fluid passage (or passageway) may be mounted on the rigid electrical raft or at least partially (for example completely) embedded in the rigid material of the rigid electrical raft. By way of example, such a fluid system may be for a gas (for example pneumatic or cooling gas/air) and/or liquid (for example a fuel, hydraulic and/or lubricant liquid).

Still further optional features, which may be applicable singly or in combination with each other, are set out below.

The fusible mount arrangement may be constructed and arranged to break at a lower load than the rigid electrical raft when a load is applied through the fusible mount arrangement. For example, the fusible mount arrangement may be constructed and arranged to break at a lower load than the rigid electrical raft when a load is applied to the body. The assembly (for example the fusible mount arrangement) may be constructed and arranged to ensure that the rigid electrical raft remains substantially undamaged when the predetermined load is applied to the assembly.

Thus, the integrity of the rigid raft may be preserved in the event that the predetermined load is reached or exceeded, for example as the result of a FBO event. The rigid electrical raft may remain intact and/or substantially functional following a FBO event. The fusible mount arrangement may be said to break, fuse, or fail in preference to the rigid electrical raft in the event that the predetermined load is reached or exceeded, for example as the result of a FBO event.

The rigid electrical raft may also be mechanically attached to the body using at least one non-fusible mount arrangement. The fusible mount arrangement may be constructed and arranged to break at a lower load than the non-fusible mount arrangement.

According to an aspect, there is provided a method of assembling a gas turbine engine having a rigid electrical raft comprising electrical conductors embedded in a rigid material, the method comprises mechanically attaching the rigid electrical raft to a fan containment structure of the gas turbine engine using at least one fusible mount arrangement that is constructed and arranged to break when a predetermined load is applied to the fan containment structure, and at least one non-fusible mount arrangement constructed and arranged to remain intact when the predetermined load is applied to the fan containment structure. The predetermined load may be equivalent to the load generated in the event of a fan blade being released from the gas turbine engine and striking the fan containment structure, such that after the predetermined load is applied, the rigid electrical raft is mechanically attached to the fan containment structure by the non-fusible mounts, but not by the fusible mounts.

The non-fusible mounting arrangement may be constructed and arranged to remain intact above the predetermined load, such that after exposure to the predetermined load, the rigid electrical raft is mechanically attached to the body by the non-fusible mounting arrangement but not by the fusible mounting arrangement. Thus, at the predetermined load, the non-fusible mounting arrangement may remain substantially uncompromised, at least to the extent that it can hold the rigid electrical raft to the body.

Thus, the rigid electrical raft may remain substantially undamaged in the event that the predetermined load is applied to the assembly, and may remain attached to the body. The rigid electrical raft may then be connected to the body at fewer fixing locations after the predetermined load has been applied, meaning that its position is still controlled and any subsequent damage is limited, whilst allowing the raft to flex in order to limit the stress within it and prevent breakage. In examples in which the body is a fan containment system, this may allow the rigid electrical raft to flex, rather than break, as loads are applied through the remaining, non-fusible, mounts after the fusible mounts have broken. Such loads may be, for example, cyclical loads which may result from the fan rotating after one or more of the blades has been released.

The fusible mount arrangement could take any suitable form. For example, at least a part of the fusible mount arrangement may be integral to the rigid electrical raft (for example, it may be made from the same material as the rigid material in which the electrical conductors are embedded). In such an arrangement, the part that is integral to the rigid electrical raft may be designed to break, for example fracture, when a load at or above the predetermined load is applied. According to such an arrangement, the load that the fusible mount arrangement can withstand before breaking may be adapted to the particular rigid electrical raft with which it is at least in part integrated. This may avoid the need to have a range of dedicated mounting parts that are constructed and arranged to break at different predetermined loads. In some embodiments, on the other hand, the part of the fusible mount arrangement that is designed to break at the predetermined load may be a separate part that is not integrated into the rigid electrical raft.

Any suitable arrangement may be used to ensure that the fusible mount arrangement breaks at the desired predetermined load. For example, the fusible mount arrangement may comprise a weakened portion at which the fusible mount arrangement is arranged to break when the fusible mount arrangement is subjected to the predetermined load. Such a weakened portion may be the result of a geometrical feature, such as a notch or groove. Accordingly, the precise position/region in which the flexible mount arrangement will fail at or above the predetermined load may be controlled and known.

When the fusible mount arrangement breaks, the rigid electrical raft may still be attached to the body (for example by non-fusible mount arrangements as described elsewhere herein). However, the rigid electrical raft may have one or more degrees of freedom in which it can move relative to the body once the fusible mount arrangement breaks. It is desirable to limit such movement so as to reduce the possibility of further damage, for example to the raft, the body or another component. As such, the assembly may further comprise a secondary location feature constructed and arranged to constrain the movement of the rigid electrical raft relative to the body after the fusible mount arrangement has broken. Such a secondary location feature may take any suitable form, such as a spigot that fits within a hole to prevent movement in the plane normal to the hole. By way of further example, the secondary location feature may comprise a tab that fits within a slot, or a lanyard connecting the body and the rigid electrical raft.

Any suitable material may be used for the rigid material of the rigid electrical raft. For example, the rigid material may be a rigid composite material, such as an organic matrix composite. Such a rigid composite material may be particularly stiff and/or lightweight. Thus, a rigid composite raft may be used that has suitable mechanical properties, whilst being thin and lightweight, for example compared with some other materials. The rigid composite material may comprise any suitable combination of resin and fibre as desired for a particular application. For example, any of the resins and/or fibres described herein may be used to produce a rigid composite material for the electrical raft. Any suitable fibres may be used, for example carbon fibres, glass fibres, aramid fibres, and/or para-aramid fibres. The fibres may be of any type, such as woven and/or chopped. Any suitable resin may be used, for example epoxy, BMI (bismaleimide), PEEK (polyetheretherketone), PTFE (polytetraflouroethylene), PAEK (polyaryletherketone), polyurethane, and/or polyamides (such as nylon).

In any example of electrical raft or electrical raft assembly, at least one of the electrical conductors embedded in the electrical raft may be an electrically conductive wire. The or each electrically conductive wire may be surrounded by an electrically insulating sleeve.

As mentioned elsewhere herein, at least some (for example a plurality) of the electrical conductors may be provided in a flexible printed circuit (FPC). Thus, at least some of the electrical conductors may be provided as electrically conductive tracks in a flexible substrate. The flexible printed circuit may be flexible before being embedded in the rigid material.

Providing the electrical conductors as tracks in a flexible printed circuit may allow the size of the resulting electrical raft to be reduced further and/or substantially minimized. For example, many different electrical conductors may be laid into a flexible printed circuit in close proximity, thereby providing a compact structure. The flexible substrate of a single flexible printed circuit may provide electrical and/or mechanical protection/isolation to a large number of electrical conductors.

Any given electrical raft may be provided with one or more electrical wires embedded therein (which may be sheathed) and/or one or more flexible printed circuits embedded therein. As such, a given electrical raft may have wires and flexible printed circuits laid therein.

It will be appreciated that the embedded electrical conductors (whether they are provided as embedded electrical wires or as conductive tracks in a flexible printed circuit embedded in the rigid material) may be described as being fixed in position by the rigid material, for example relative to the rest of the electrical harness raft. It will also be appreciated that the embedded electrical conductors may be said to be surrounded by the rigid material and/or buried in the rigid material and/or integral with (or integrated into) the rigid material.

The electrical raft may comprise one or more electrical connectors or sockets, which may be electrically connected to at least one of the embedded electrical conductors. The electrical connector or socket may allow electrical connection of the electrical raft to other electrical components, for example to other electrical rafts (either directly or indirectly, via an electrical cable or lead) or to electrical units (again, either directly or indirectly, via an electrical cable or lead). Such an electrical connector or socket may take any suitable form, and may be at least partially embedded in the rigid electrical raft.

There is also provided a method of servicing a gas turbine engine comprising an electrical raft as described herein. The method comprises removing the electrical raft from a gas turbine engine; and installing a second, pre-prepared, electrical raft onto the gas turbine engine in place of the removed electrical raft. The second, pre-prepared electrical raft may be of the same, or a modified specification as the removed electrical raft.

The removed electrical raft may, for example, be tested and/or repaired (if necessary) once removed from the gas turbine engine. The removed and optionally tested and/or repaired electrical raft may then be used as the replacement (or second) raft during another service, which may be of the same or a different engine.

According to an aspect, there is provided a gas turbine engine comprising an assembly as described herein. The electrical raft of the assembly may form a first engine installation component. The gas turbine engine may comprise a second engine installation component comprising electrical conductors. At least one flexible cable may be electrically connected between the electrical raft (or first engine installation component) and the second engine installation component. Thus, the flexible cable(s) may electrically connect electrical conductors of the electrical raft with electrical conductors of the second engine installation component.

The second engine installation component may be, for example, an ECU, such as an EMU or EEC. Additionally or alternatively, the second engine installation component may be a further electrical raft or electrical raft assembly.

The environment of a gas turbine engine during operation may be particularly severe, with, for example, high levels of vibration and/or differential expansion between components as the temperature changes through operation and as the components move relative to each other. Providing at least one flexible cable to connect an electrical raft assembly to another component may allow the electrical rafts and/or components to accommodate vibration and/or relative movement, for example of the component(s)/assemblies to which they are attached/mounted during use. For example, the flexible cable(s) (where present) used to electrically connect electrical raft assemblies to other component(s) may have sufficient length to accommodate such vibration and/or movement during use.

For example, providing separate (for example more than one) electrical raft assemblies and connecting at least some (for example at least two) of them together using at least one flexible cable may allow the electrical rafts to accommodate vibration and/or relative movement of the component(s)/assemblies to which they are attached/mounted during use.

The electrical signals transferred by the conductors in the electrical raft, and around the engine using the electrical rafts/raft assemblies may take any form. For example, the electrical signals may include, by way of non-limitative example, electrical power and/or electrical control/communication signals and/or any other type of transmission through an electrical conductor. Transmission of signals around the engine may mean transmission of signals between (to and/or from) any number of components/systems in the engine and/or components/system of a structure (such as an airframe) to which the gas turbine engine is (or is configured to be) connected/installed in. In other words, an electrical raft may be used to transfer/communicate any possible combination of electrical signals in any part of a gas turbine engine installation or a related (for example electrically and/or mechanically connected) structure/component/system.

A rigid electrical raft may be provided in any suitable location/position of the gas turbine engine, for example using at least one fusible mount arrangement as described herein. For example, the gas turbine engine may comprise a bypass flow duct formed between an engine core and an engine fan casing (the gas turbine engine may be a turbofan engine, for example); and the electrical raft assembly may form at least a part of a radially extending splitter (which may be referred to as a bifurcation) that extends across the bypass flow duct. In this way, an electrical raft (which may be referred to as a splitter electrical raft) may provide an electrical connection between a fan casing and an engine core. By way of further example, the electrical raft assembly may be attached to the engine core case or engine fan case.

An anti-vibration mount may be used to attach an electrical raft to another component, thereby allowing the electrical raft to be vibration isolated (or at least substantially vibration isolated). The fusible mount arrangement and/or (where present) the non-fusible mount arrangement may be anti-vibration mounts.

Using an anti-vibration mount to attach an electrical raft/assembly to a gas turbine engine for example may reduce (or substantially eliminate) the amount (for example the amplitude and/or the number/range of frequencies) of vibration being passed to the electrical raft from the gas turbine engine, for example during use. This may help to prolong the life of the electrical raft. Furthermore, any other components that may be attached to the electrical raft (as discussed above and elsewhere herein) may also benefit from being mounted to the gas turbine engine via the anti-vibration mounts, through being mounted on the electrical raft. For example, the reduced vibration may help to preserve the electrical contact between the electrical raft and any electrical unit connected thereto. As such, any components (such as an electrical unit mounted to the electrical raft) that would conventionally be mounted directly to the gas turbine engine and require at least a degree of vibration isolation no longer require their own dedicated anti-vibration mount. Thus, the total number of anti-vibration mounts that are required to assemble an engine may be reduced. This may reduce the number of parts required and/or the time taken to assemble an engine or engine installation and/or reduce the total assembled weight and/or reduce the likelihood of errors occurring during assembly.

Furthermore, components that are conventionally mounted to an engine without anti-vibration mounts (for example because of the weight and/or cost penalty), but which are now mounted to an electrical raft (for example to a mounting surface of the electrical raft), may benefit from vibration isolation without any weight/cost/assembly time penalty. This may reduce the possibility of damage occurring to such components and/or increase their service life. Such components may include, for example, ignitor boxes (used to provide high voltage power to engine ignitors), and pressure sensors/switches, for example for fluid systems such as oil, air, fuel, pneumatics and/or hydraulics.

BRIEF DESCRIPTION OF THE DRAWINGS

The disclosure will now be described, by way of example only, with reference to the accompanying Figures, in which.

DETAILED DESCRIPTION OF THE PREFERRED EMBODIMENTS

Figure 2:
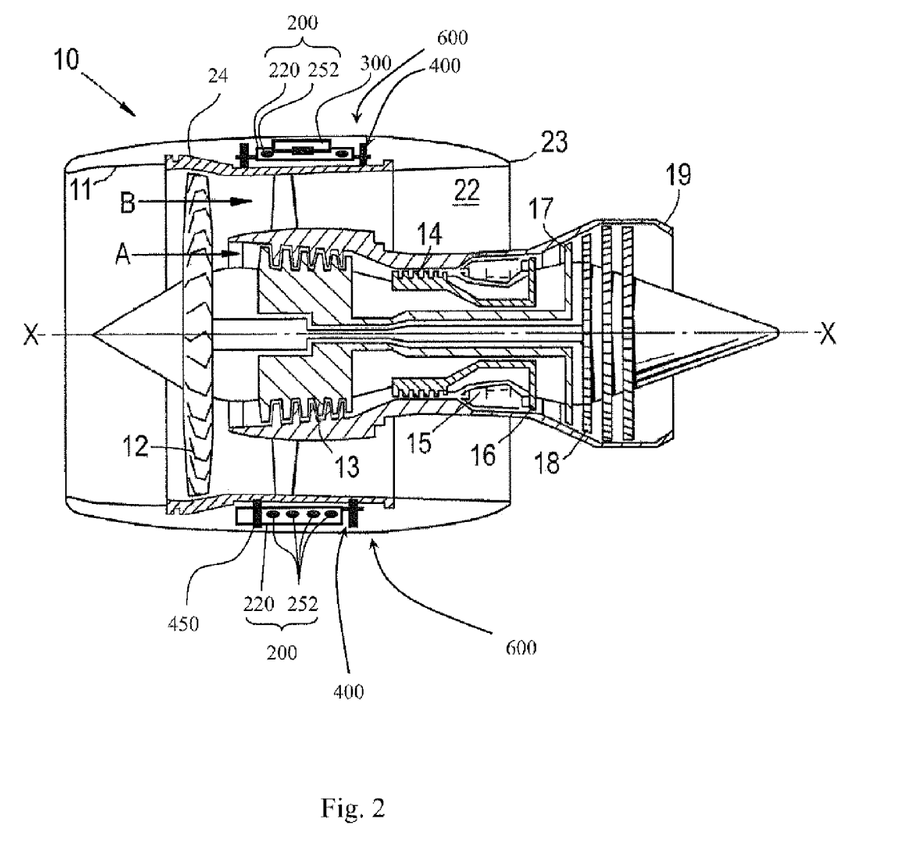
FIG. 2 shows a cross-section through a gas turbine engine having an assembly including a rigid electrical raft in accordance with an example of the present invention.

With reference to FIG. 2, a ducted fan gas turbine engine generally indicated at 10 has a principal and rotational axis X-X. The engine 10 comprises, in axial flow series, an air intake 11, a propulsive fan 12, an intermediate pressure compressor 13, a high-pressure compressor 14, combustion equipment 15, a high-pressure turbine 16, and intermediate pressure turbine 17, a low-pressure turbine 18 and a core engine exhaust nozzle 19. The engine also has a bypass duct 22 and a bypass exhaust nozzle 23.

The gas turbine engine 10 works in a conventional manner so that air entering the intake 11 is accelerated by the fan 12 to produce two air flows: a first air flow A into the intermediate pressure compressor 13 and a second air flow B which passes through the bypass duct 22 to provide propulsive thrust. The intermediate pressure compressor 13 compresses the air flow A directed into it before delivering that air to the high pressure compressor 14 where further compression takes place.

The compressed air exhausted from the high-pressure compressor 14 is directed into the combustion equipment 15 where it is mixed with fuel and the mixture combusted. The resultant hot combustion products then expand through, and thereby drive the high, intermediate and low-pressure turbines 16, 17, 18 before being exhausted through the nozzle 19 to provide additional propulsive thrust. The high, intermediate and low-pressure turbines 16, 17, 18 respectively drive the high and intermediate pressure compressors 14, 13 and the fan 12 by suitable interconnecting shafts.

The gas turbine engine 10 shown in FIG. 2 shows two assemblies 600 (which may be referred to herein as electrical raft assemblies 600) according to the present invention. As such, the gas turbine engine 10 is in accordance with the present invention. Each electrical raft assembly 600 comprises a rigid electrical raft 200 (which may be referred to herein as an electrical raft 200 or an electrical harness raft 200). The electrical rafts 200 may be used to transmit/transfer electrical signals (or electricity, including electrical power and/or electrical control signals) around the engine and/or to/from the engine 10 from other components, such as components of an airframe. The function and/or construction of each electrical raft 200 and electrical raft assembly 600 may be as described above and elsewhere herein.

In FIG. 2, each electrical raft 200 comprises at least one electrical conductor 252 embedded in a rigid material 220, which may be a rigid composite material. The assemblies 600 also comprise at least one fusible mount arrangement 400. Two fusible mount arrangements 400 are shown in the upper assembly 600 of FIG. 2, and one fusible mount arrangement 400 is shown in the lower assembly 600. The fusible mount assemblies 400 may be as described by way of example herein, for example in relation to FIGS. 3 to 9.

Figure 3:
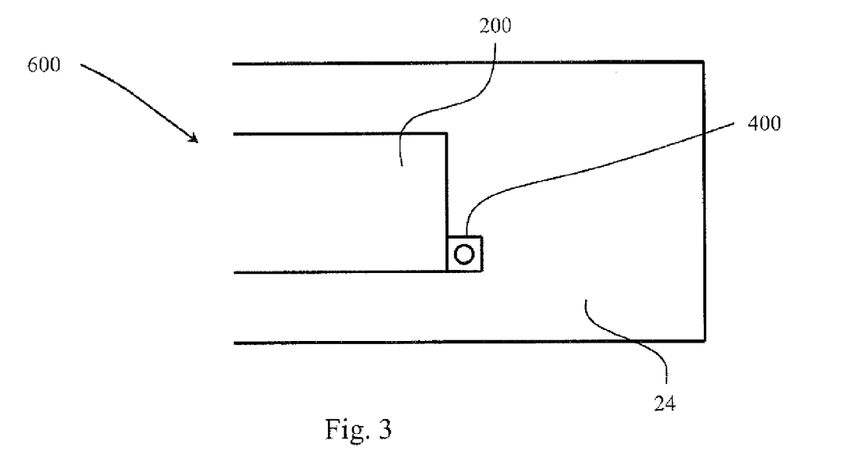
FIG. 3 shows a schematic plan view of an assembly in accordance with an example of the present invention.
Figure 4:
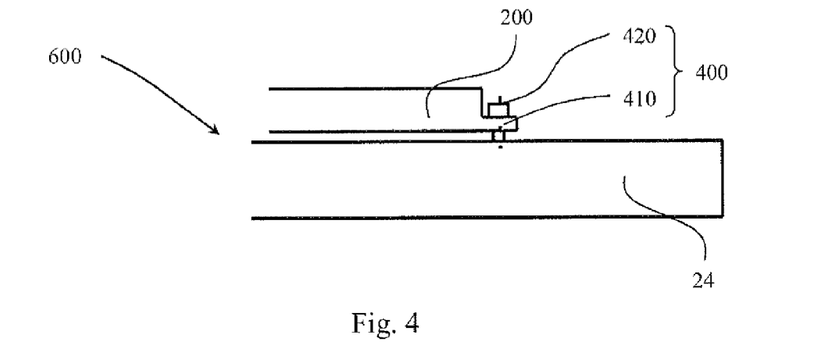
FIG. 4 shows a schematic side view of an assembly in accordance with an example of the present invention.

FIG. 3 shows a plan view of an assembly 600 in accordance with an example of the invention. The assembly 600 comprises a rigid electrical raft 200 mounted onto a fan case 24 of a gas turbine engine 10 using a fusible mount arrangement 400. It will be appreciated that only a part of the assembly 600 is shown in FIG. 3. FIG. 4 shows a side-view of the arrangement shown in FIG. 3.

The fusible mount arrangement is constructed and arranged to break in preference to the rest of the assembly in the event of the assembly having an excessive load applied thereto, for example through the fan case 24 (which is an example of a body 24 to which the rigid electrical raft 200 may be mounted). Such an excessive load may result, for example, from a fan blade being unintentionally released from the fan 12, for example due to a failure.

In this regard, engine designs must be certified to survive a fan blade-off (FBO) event, including the ability for the engine to be shutdown and put into a safe condition. For this to happen, many of the electrical signals and units (such as the EEC) must remain intact during and after the FBO event. In the case of an engine that comprises rigid electrical rafts 200, for example as at least a part of the electrical harness, this means that the rafts 200 themselves must not break and must be generally retained in position, at least to the extent that they do not cause further problems by contact with other components. If not addressed, such problems might include the breakage of any PCB harnesses that connect adjacent rafts 200 or allowing parts 300 mounted on the rafts, such as the EEC, to contact/impact other components, such as fan cowl doors. This problem is most severe on the fan case 24 where the highest loadings will manifest themselves.

A fan blade-off event produces high displacements of a highly dynamic/cyclic nature. The highest loads are during the event as the fan 12 continues to rotate with one (or more than one) blade missing as the engine 10 spools down but then continues at wind-milling speed for the journey to the nearest airport which could be many hours away. Hence, the initial event is followed by a cyclic loading for a very considerable number of cycles.

It is therefore important that the rigid electrical rafts 200 are protected from the extreme loadings generated in a FBO event. The fusible mount arrangement 400 provides such protection. In the event of a FBO scenario, the load transmitted from the released blade to the fan case 24, and then to the mount arrangements 400 may be sufficient to break the flexible mount arrangements 400, thereby removing that load path to the rigid electrical raft 200, and/or allowing the rigid electrical raft 200 to flex more easily with the movement of the fan case 24. This may ensure that the rigid electrical rafts 200 are not subjected to loads which might cause unacceptable damage, for example by breaking the rigid (such as carbon fibre) structure 220 and/or damaging the electrical conductors 252 embedded therein. Providing at least one fusible mount arrangement 400 may allow the rigid electrical raft 200 to flex sufficiently to avoid breakage.

The load (or impulse or impact) required for the fusible mount arrangement 400 to break (or fuse) may be determined by any suitable method. In the example of a fusible mount arrangement 400 for mounting a rigid electrical raft 200 to a fan case 24 of a gas turbine engine 10, the load may be determined by the load that is expected to be generated at the mount 400 in a FBO event and/or the load/deflection that the rigid electrical raft 200 can withstand before breaking.

Purely by way of example, the peak acceleration experienced through a fan case during normal operation may be on the order of 20 g-60 g (where 'g' the acceleration due to gravity), for example around 40 g. Where a rigid electrical raft is attached to a fan case, the fusible mount would typically be set to break at a predetermined load no lower than 5% to 50%, for example 10% to 40%, for example 20% to 25% greater than the load resulting from this expected peak acceleration.

Also by way of example, the peak acceleration experienced through a fan case during a FBO event may be on the order of 150 g-300 g (where 'g' the acceleration due to gravity), for example around 200 g-250 g. Where a rigid electrical raft is attached to a fan case, the fusible mount would typically be set to break at a predetermined load no greater than 5% to 50%, for example 10% to 40%, for example 20% to 25% below the load resulting from this expected peak acceleration. Of course, the load at which the fusible mount is set to break should still be set to a level that ensures it does not break during normal operation.

In practice, the load that is expected to be generated at the mount 400 in a FBO event may be predicted using fan blade-off analysis using whole-engine-models. Such models may allow the fusible mount arrangements 400 (and optionally any non-fusible mount arrangements) to be arranged (for example positioned and/or sized) to produce the optimum loading profiles to be exerted to the rigid electrical raft 200 in order to ensure that the raft remains unbroken (or at least provides the best chance of it remaining unbroken) in an FBO event.

The fusible mount arrangement 400 may comprise a fixing 420 (such as a bolt, for example), and a fusible portion 410, as shown in the example of FIGS. 3 and 4. In the example of FIGS. 3 and 4, the fusible portion 410 is an integral part of the rigid electrical raft 200. This may mean that it is manufactured at the same time and/or in the same process and/or using the same material as the rest of the rigid electrical raft 200. Thus, the fusible portion 410 may be manufactured from an organic matrix composite material, such as carbon fibre.

In alternative arrangements, however, the fusible mount arrangement 400 may be constructed and arranged to break at a separate part, at least apart of which may not be integral to the rigid electrical raft 200. For example, the fusible mount arrangement 400 may have a fixture 420 that is constructed and arranged to break at a predetermined load.

It may be advantageous to have the fusible part (be it integral to the raft 200 or otherwise) of the fusible mount arrangement 400 manufactured from a material that breaks in a predictable manner, and whose properties remain substantially unchanged over time and/or with use. Such a material may be, for example, an organic matrix composite, such as carbon fibre.

In general, a fusible portion 410 of the fusible mount arrangement 400, in whatever form it takes, would typically be strong enough to survive the loads generated during normal usage (such as during manufacture/assembly and in service), but sufficiently weak that it breaks at the desired load (which may be that resulting from a FBO event).

Figure 5:
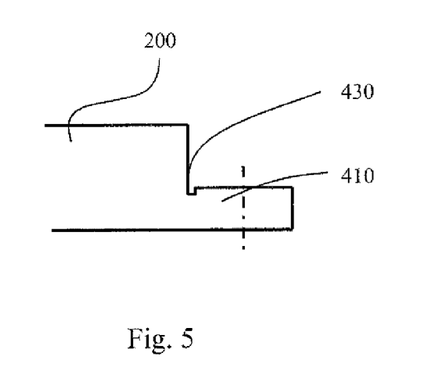
FIG. 5 shows a close-up side view of an example of a fusible mount arrangement in accordance with an example of the present invention.

The fusible mount arrangement 400 may have a specifically weakened portion at which it is designed to break when subjected to an excessive predetermined load. An example of such a weakened portion 430 is shown in FIG. 5. In FIG. 5, the weakened portion 430 is a simple notch, or channel, which is thinner, and thus weaker, than the rest of the fusible mount arrangement 400 (and in particular the fusible portion 410, which may be referred to as a "lug", in the FIG. 5 example), and thus breaks in preference to the rest of the structure (i.e. at a lower load).

In examples in which the fusible portion 410 is integral to the rigid electrical raft 200, there may be a step change in material thickness between the raft 200 and the fusible portion 410, as in the examples shown in FIGS. 4 and 5. This may be useful in generating a stress concentration at the step, thereby promoting controlled breakage at the step under the desired load.

Figure 6:
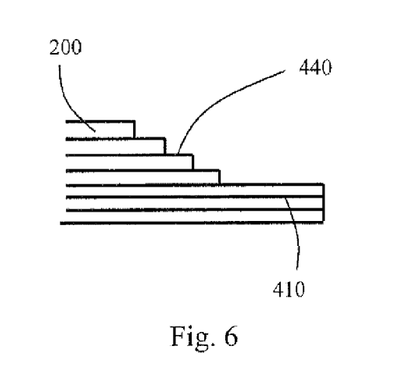
FIG. 6 shows a close-up side view of another example of a fusible mount arrangement in accordance with an example of the present invention.

Alternatively, however, the thickness may be gradually reduced from the main body of the rigid electrical raft 200 to a part of the fusible mounting arrangement 410 that is integral to the rigid electrical raft 200, as shown in the FIG. 6 example. This may be particularly straightforward in examples in which the rigid electrical raft is manufactured by carbon fibre sheets by gradually reducing the number of sheets. Such an arrangement may have weight advantages.

Figure 7:
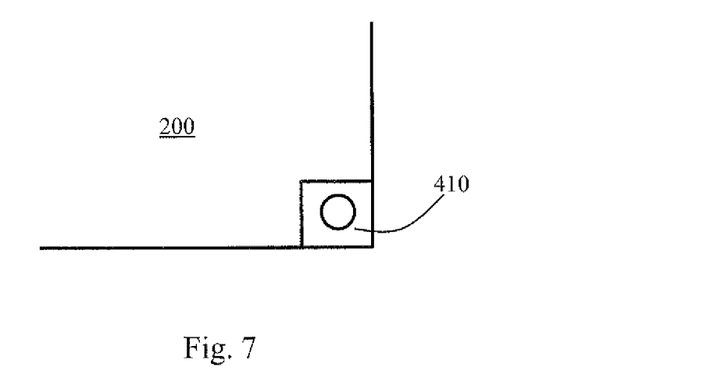
FIG. 7 shows a plan view of an example of a fusible mount arrangement in accordance with an example of the present invention.
Figure 8:
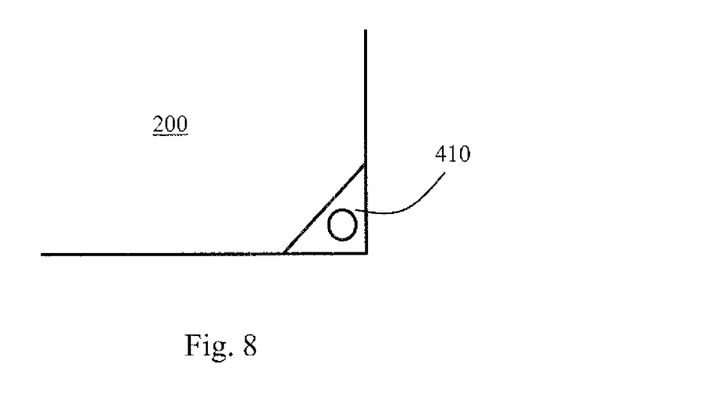
FIG. 8 shows a plan view of another example of a fusible mount arrangement in accordance with an example of the present invention.
Figure 9:
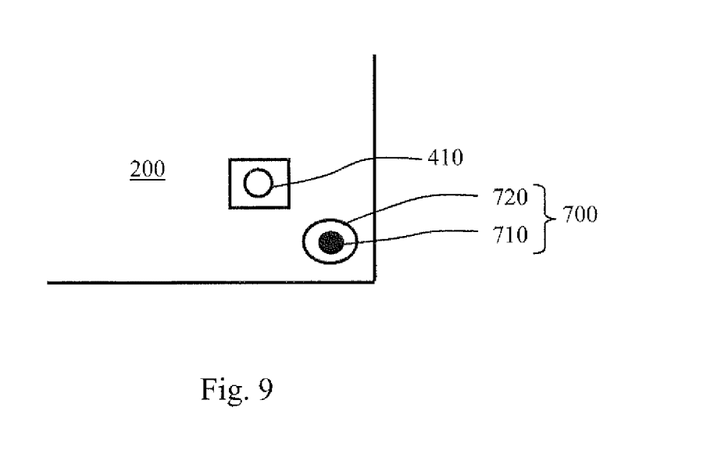
FIG. 9 shows a plan view of another example of a fusible mount arrangement in accordance with an example of the present invention, including a secondary location feature.

The fusible mount arrangement 400 may be provided in any suitable location relative to the rigid electrical raft 200. For example, for arrangements in which a part of the fusible mount arrangement 400 is integral to the rigid electrical raft 200, that part may be located in any suitable position on the rigid electrical raft. FIGS. 7 to 9 give examples of such positions.

The fusible mount arrangement 400 may have a fusible portion 410 located on an edge of the rigid electrical raft 200 and/or at a corner of a rigid electrical raft 200, as in the examples shown in FIGS. 7 and 8. Alternatively, a fusible portion 410 may be within the periphery of the rigid electrical raft 200, and thus surrounded by the rest of the rigid electrical raft 200, as in the FIG. 9 example. A fusible portion 410 may take any suitable shape in plan view, such as an ellipse, circle, rectangle (as in FIG. 9), square (as in FIG. 7), or triangle (as in FIG. 8). The solid lines at the edge of the fusible portions 410 in FIGS. 7 to 9 represent failure lines along which the fusible portions 410 are constructed and arranged to break when subjected to a predetermined load.

The arrangement of FIG. 9 also shows an example of a secondary location feature 700. The secondary location feature comprises a spigot 710 that is rigidly connected to, or a part of, the fan case (or more generally the body) 24 that locates inside a hole 720 in the rigid electrical raft 200. In the event that the fusible mount arrangement 400 breaks, the secondary location feature 700 helps to constrain the movement of the rigid electrical raft 200, whilst still allowing it to flex as desired. Various other arrangements of secondary location features may be used. Purely by way of example, the arrangement shown in FIG. 9 could comprise an end-cap arrange to constrain motion of the raft 200 in the out-of-page direction (i.e. normal to the major surface of the raft). Although only shown in relation to FIG. 9, it will be appreciated that a secondary location feature could be used in any embodiment of the invention.

Although the rigid electrical raft 200 is shown as being directly attached to the fan case 24 using a fixture 420 in FIGS. 3 and 4, a rigid electrical raft 200 may be mounted to a body (such as a fan case 24) via a bracket. Such a bracket may be a part of the fusible mount arrangement 400. Indeed, such a bracket may be at least a part of the fusible portion of a fusible mount arrangement 400, i.e. it may be constructed and arranged to break when subjected to a predetermined load.

The rigid electrical raft 200 may be attached to the body 24 using any suitable number of mounts, at least one of which may be a fusible mount arrangement 400. As mentioned herein, the rigid electrical raft assembly 600 may also comprise at least one non-fusible mount arrangement. Such a non-fusible mount arrangement 450 is shown in FIG. 2. A non-fusible mount arrangement 450 may keep the rigid electrical raft 200 attached to the body 24 even after the fusible mount arrangements 400 have been broken. A non-fusible mount arrangement 450 may be any type of conventional mount arrangement, for example.

A fusible mount arrangement 400 could be used to attach a rigid electrical raft 200 to any other body including, for example, another rigid raft, which may also include embedded conductors 252 and thus may be another rigid electrical raft 200.

Figure 10:
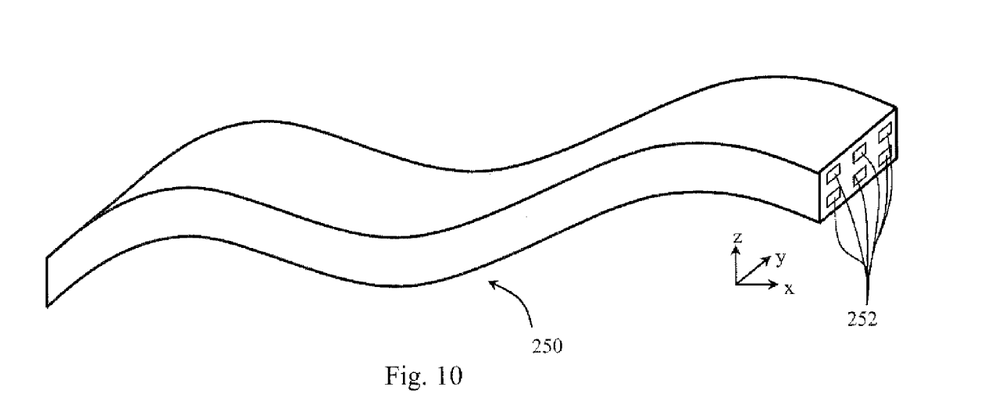
FIG. 10 shows a perspective view of a flexible printed circuit.
Figure 11:
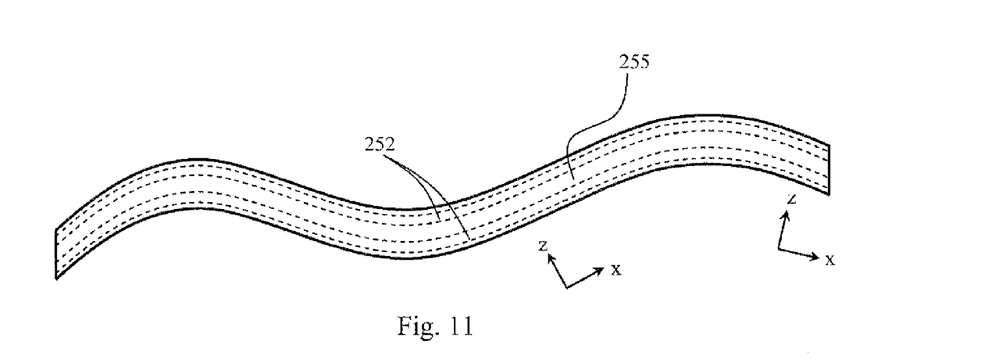
FIG. 11 shows a side view of the flexible printed circuit of FIG. 10.

Although not shown in FIGS. 3 to 9 to aid clarity, the rigid electrical raft 200 shown in these Figures comprises electrical conductors 252 (for example in the form of electrical wires and/or flexible PCBs) embedded in a rigid material 220, as described by way of example elsewhere herein. An example of an FPC 250 in which the electrical conductors 252 may be provided is shown in greater detail in FIGS. 10 and 11. FIG. 10 shows a perspective view of the FPC 250, and FIG. 11 shows a side view.

Such an FPC 250 may comprise a flexible (for example elastically deformable) substrate 255 with conductive tracks 252 laid/formed therein. The FPC 250 may thus be deformable. The FPC 250 may be described as a thin, elongate member and/or as a sheet-like member. Such a thin, elongate member may have a major surface defined by a length and a width, and a thickness normal to the major surface. In the example shown in FIGS. 10 and 11, the FPC 250 may extend along a length in the x-direction, a width in the y-direction, and a thickness (or depth or height) in the z-direction. The x-direction may be defined as the axial direction of the FPC. Thus, the x-direction (and thus the z-direction) may change along the length of the FPC 250 as the FPC is deformed. This is illustrated in FIG. 11. The x-y surface(s) (i.e. the surfaces formed by the x and y directions) may be said to be the major surface(s) of the FPC 250. In the example shown in FIGS. 10 and 11, the FPC 250 is deformable at least in the z direction, i.e. in a direction perpendicular to the major surface. FPCs may be additionally of alternatively deformable about any other direction, and/or may be twisted about any one or more of the x, y, or z directions.

The flexible substrate 255 may be a dielectric. The substrate material may be, by way of example only, polyamide. As will be readily apparent, other suitable substrate material could alternatively be used.

The conductive tracks 252, which may be surrounded by the substrate 255, may be formed using any suitable conductive material, such as, by way of example only, copper, copper alloy, tin-plated copper (or tin-plated copper alloy), silver-plated copper (or silver-plated copper alloy), nickel-plated copper (or nickel-plated copper alloy) although other materials could alternatively be used. The conductive tracks 252 may be used to conduct/transfer electrical signals (including electrical power and electrical control signals) through the rigid raft assembly (or assemblies) 200, for example around a gas turbine engine 10 and/or to/from components of a gas turbine engine and/or an airframe attached to a gas turbine engine.

The size (for example the cross-sectional area) and/or the shape of the conductive tracks 252 may depend on the signal(s) to be transmitted through the particular conductive track 252. Thus, the shape and/or size of the individual conductive tracks 252 may or may not be uniform in a FPC 250.

The example shown in FIGS. 10 and 11 has 6 conductive tracks 252 running through the substrate 255. However, the number of conductive tracks 252 running through a substrate 255 could be fewer than 6, or greater than 6, for example tens or hundreds of tracks, as required. As such, many electrical signals and/or power transmission lines may be incorporated into a single FPC 250.

A single FPC 250 may comprise one layer of tracks, or more than one layer of tracks, for example, 2, 3, 4, 5, 6, 7, 8, 9, 10 or more than 10 layers of tracks. An FPC may comprise significantly more than 10 layers of tracks, for example at least an order of magnitude more layers of tracks. In this regard, a layer of tracks may be defined as being a series of tracks that extend in the same x-y surface. Thus, the example shown in FIGS. 10 and 11 comprises 2 layers of tracks, with each layer comprising 3 tracks 252.

An electrical raft 200 as described and claimed herein may be manufactured using any suitable method. For example, the rigid material 220 may initially be provided as layers of flexible material, such as (by way of example only) layers of fibre and resin compound. This flexible material may be placed into a mould, for example having a desired shape. Other components (such as fluid pipes 210 and/or the electrical conductors 252, which may be embedded in a FPC 250) may also be placed into the mould, for example between layers of the flexible material from which the rigid material 220 is ultimately formed. Parts of the mould may have any suitable form and/or construction, for example that could be readily removed when the electrical raft 200 is formed into the desired shape. A fusible portion 410 of the fusible mount arrangement may be formed with the rigid electrical raft 200, as described by way of example elsewhere herein.

Figure 12:
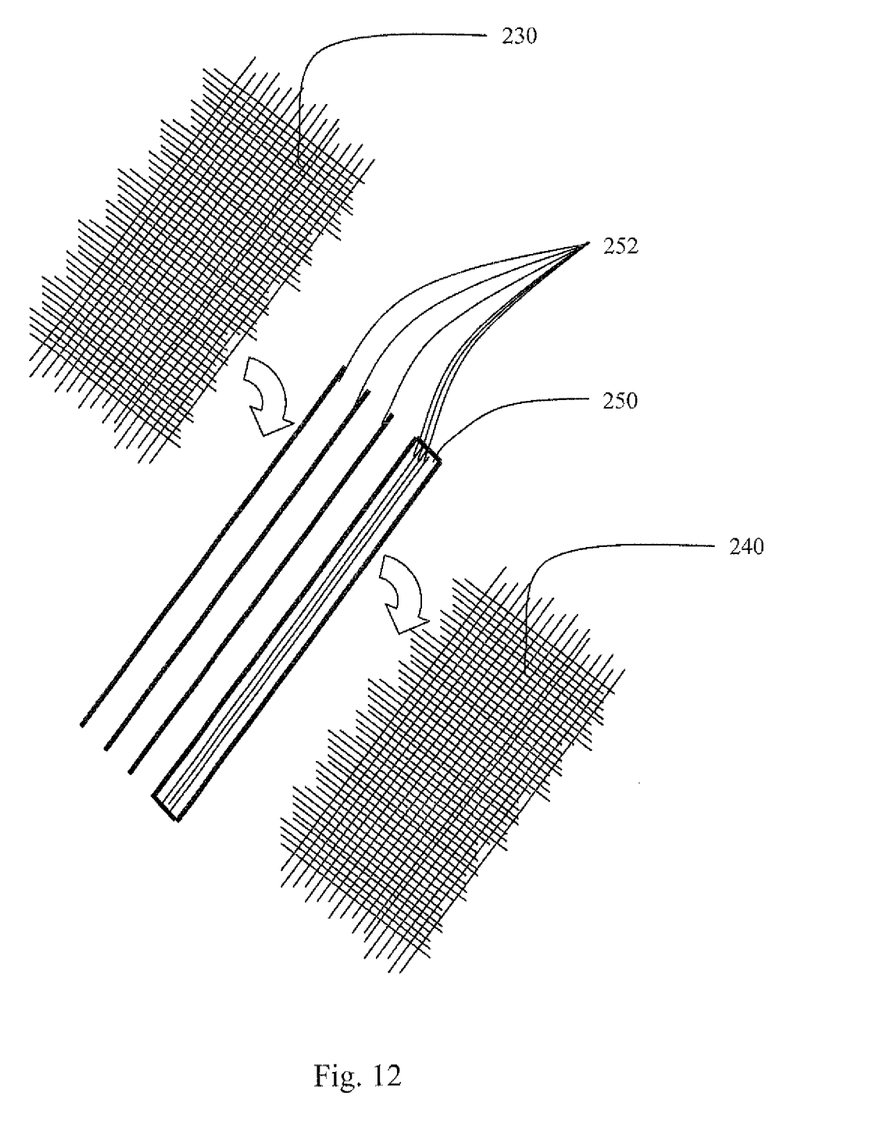
FIG. 12 shows a schematic of an electrical raft prior to assembly.

FIG. 12 shows components of an example of an electrical raft 200 prior to one method of construction. The electrical conductors 252 are provided between two layers of material 230, 240 that, after construction, form the rigid material 220. Some of the electrical conductors 252 are provided in an FPC 250. The material 230, 240 may be a fibre and resin compound, as described elsewhere herein. Such a fibre and resin compound may, after suitable treatment (for example heat treatment), produce the rigid composite material 220. In the example of FIG. 12, the fibre and resin compound is formed of a sheet of interwoven fibres, or strands. The strands in FIG. 12 extend in perpendicular directions, although the strands may extend in any one or more directions as required. The strands/fibres may be pre-impregnated (or "pre-pregged") with the resin.

Prior to any treatment, both the first and second layers 230, 240 and the electrical conductors 252 may be flexible, for example supple, pliable or malleable. As such, when the layers 230, 240 and the electrical conductors 252 are placed together, they may be moulded, or formed, into any desired shape. For example, the layers 230, 240 and the electrical conductors 252 may be placed into a mould (which may be of any suitable form, such as a glass or an aluminium mould) having the desired shape. The desired shape may be, for example, a shape that corresponds to (for example is offset from) a part of a gas turbine engine, such as, by way of example only, at least a part of a casing, such as an engine fan casing or engine core casing. This may enable the final raft to adopt shapes that are curved in two-dimensions or three-dimensions, and/or to include fusible portions (or lugs) 410.

Any suitable method could be used to produce the electrical raft 200. For example, the strands/fibres need not be pre-impregnated with the resin. Instead, the fibres/strands could be put into position (for example relative to electrical conductors 252/FPC 250) in a dry state, and then the resin could be fed (or pumped) into the mould. Such a process may be referred to as a resin transfer method. In some constructions no fibre may be used at all in the rigid material 220.

Figure 13:
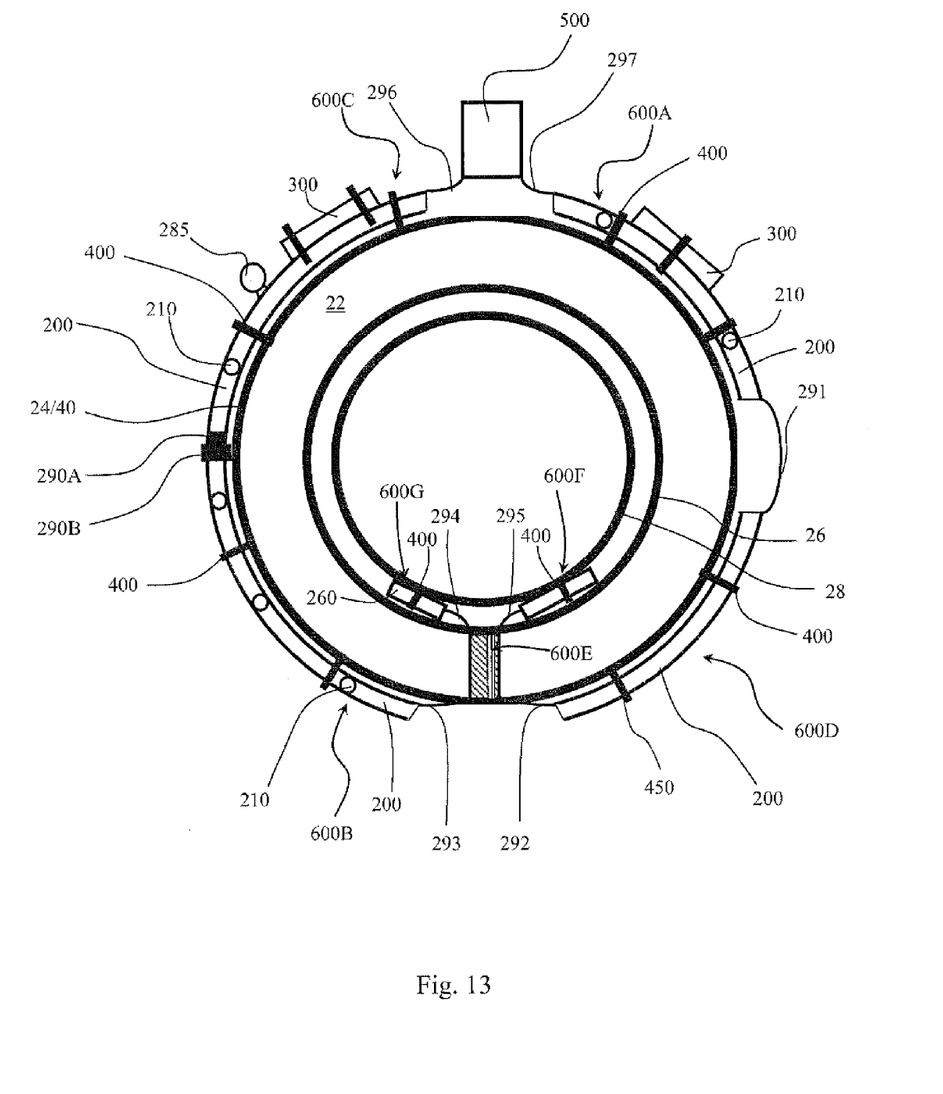
FIG. 13 shows a cross-section normal to the axial direction through a gas turbine engine according to an example of the invention.

FIG. 13 is a schematic showing a cross-section perpendicular to the direction X-X of a gas turbine engine comprising assemblies, or electrical raft assemblies, 600A-600G. Each of the electrical raft assemblies 600A-600G comprises an electrical raft 200 and at least one fusible mount arrangement 400 (which are not shown in detail in FIG. 13), which mounts the respective rigid electrical raft 200 to a part of the gas turbine engine 10. Any one of the electrical raft assemblies 600A-600G (which may collectively be referred to as electrical raft assemblies 600) may comprise a non-fusible mounting assembly 450, as shown by way of example for the assembly 600D.

The body to which the rigid electrical raft is mounted is part of a fan case 24 for electrical raft assemblies 600A-600D, part of a bifurcation splitter that radially crosses a bypass duct 22 for electrical raft assembly 600E and part of an engine core case 28 for electrical raft assemblies 600F and 600G. However, it will be appreciated that an electrical raft assembly 600 could be mounted in any suitable and/or desired location on a gas turbine engine.

In FIG. 13, two electrical raft assemblies 600A, 600C are shown as having an electrical unit 300 mounted on the respective electrical raft 200. However, any (or none) of the electrical raft assemblies 600A-600G may have an electrical unit 300 mounted on the respective electrical raft 200.

As mentioned herein, each of the electrical rafts 200 associated with the electrical raft assemblies 600A-600G shown in FIG. 13 comprises one or more electrical conductors 252 embedded therein. However, any one or more of the electrical rafts 200 may be replaced with a raft that does not comprise electrical conductors 252. Such a raft would not be an electrical raft 200, but may otherwise be as described elsewhere herein, for example it may be a rigid raft that may have components/systems (such as, by way of example only, fluid systems, such as pipes) mounted thereon and/or embedded therein. Thus, for example, a gas turbine engine in accordance with the present invention may have a combination of electrical rafts 200 and non-electrical rafts.

At least one of the raft assemblies 600A-600G may be replaced with an assembly that does not comprise a fusible mount arrangement 400. For example, the assemblies 600E-600G may be replaced with assemblies that do not comprise a fusible mount arrangement 400. Thus, the gas turbine engine may comprise at least one rigid electrical raft 200 attached to the engine using at least one fusible mount arrangement 400, and at least one raft attached the engine without using a fusible mount arrangement 400.

The arrangement of electrical raft assemblies 600A-600G shown in FIG. 13 is by way of example only. Alternative arrangements, for example in terms of number, size, shape and/or positioning, of electrical raft assemblies 600A-600G may be used. For example, there need not be 7 electrical raft assemblies, the assemblies may or may not be connected together, and the rafts could be provided to (for example mounted on) any one or more components of the gas turbine engine. Purely by way of example only, connection between electrical raft assemblies 600A-600D mounted on the fan casing 24 to the electrical raft assemblies 600F, 600G mounted on the core casing 28 may be provided at least in part by means other than an additional electrical raft assembly 600E, for example using wire conductors with insulating sleeves. By way of further example, one or more electrical raft assemblies 600 may additionally or alternatively be provided to the nose cone, structural frames or elements within the engine (such as "A-frames"), the nacelle, the fan cowl doors, and/or any connector or mount between the gas turbine engine 10 and a connected structure (which may be at least a part of a structure in which the gas turbine engine 10 is installed), such as the pylon 500 between the gas turbine engine 10 and an airframe (not shown).

Any one or more of the electrical rafts of the electrical raft assemblies 600A-600G may have a fluid passage 210 embedded therein and/or provided thereto. The fluid passage 210 may be part of a fluid system, such as a gas (for example pneumatic or cooling gas/air) and/or liquid (for example a fuel, hydraulic and/or lubricant liquid). In the FIG. 13 example, three of the electrical rafts (of electrical raft assemblies 600A, 600B, 600C) comprise a fluid passage 210 at least partially embedded therein. The electrical raft of assembly 600C also has a fluid passage 285 (which may be for any fluid, such as those listed above in relation to embedded passage 210) mounted thereon. Such a mounted fluid passage 285 may be provided to any electrical raft, such as those of electrical raft assemblies 600A-600G shown in FIG. 13. The fluid passages 210, 285 shown in FIG. 13 may be oriented in an axial direction of the engine 10. However, fluid passages may be oriented in any direction, for example axial, radial, circumferential or a combination thereof.

Any of the electrical raft assemblies 600A-600G (or the respective electrical rafts 200 thereof) may have any combination of mechanical, electrical and/or fluid connections to one or more (for example 2, 3, 4, 5 or more than 5) other components/systems of the gas turbine engine 10 and/or the rest of the gas turbine engine 10. Examples of such connections are shown in FIG. 13, and described below, but other connectors may be used. For example, electrical raft assemblies 600 (and/or non-electrical rafts) may be connected together (or to other components) using any combination of electrical, fluid and/or mechanical connectors. Thus, any of the electrical connections 290A/290B, 291-297 shown in FIG. 13 may be any combination of electrical, fluid and/or mechanical connection. Alternatively, electrical raft assemblies 600 (and/or non-electrical rafts) may be standalone, and thus may have no connection to other rafts or components.

A connection 291 is shown between the electrical rafts of the assemblies 600A and 600D. The connection 291 may comprise an electrical connection. Such an electrical connection may be flexible and may, for example, take the form of a flexible printed circuit such as the flexible printed circuit 250 shown in FIGS. 10 and 11. Such a flexible electrical connection may be used to electrically connect any electrical raft assembly 600 to any other component, such as another electrical raft assembly 600. A connection 297 (which may be or comprise an electrical connection) is provided between the electrical raft of the assembly 600A and a part of an airframe, or airframe installation 500, which may, for example, be a pylon. Similarly, a fluid and/or mechanical connection 296 may additionally or alternatively be provided between the airframe 500 and another electrical raft of the assembly 600C. As shown in FIG. 13, other electrical and/or fluid connections 292, 293, 294, 295 may be provided between electrical rafts 200 (or assemblies 600) and other components, such as other electrical rafts 200 (or assemblies 600).

A direct connection 290A, 290B may be provided, as shown for example between the electrical rafts of the assemblies 600B and 600C in the FIG. 13 arrangement. Such a direct connection 290A, 290B may comprise a connector 290A provided on (for example embedded in) one electrical raft 200 connected to a complimentary connector 290B provided on (for example embedded in) another electrical raft 200. Such a direct connection 290A, 290B may, for example, provide fluid and/or electrical connection between the two electrical rafts assemblies 600B, 600C. The direct connection may comprise a fusible mount arrangement 400, and thus one of the rigid rafts 200 of the assemblies 600B, 600C may be considered to be a body to which the other rigid raft 200 is attached via a fusible mount arrangement 400.

Where reference is made herein to a gas turbine engine, it will be appreciated that this term may include a gas turbine engine/gas turbine engine installation and optionally any peripheral components to which the gas turbine engine may be connected to or interact with and/or any connections/interfaces with surrounding components, which may include, for example, an airframe and/or components thereof. Such connections with an airframe, which are encompassed by the term 'gas turbine engine' as used herein, include, but are not limited to, pylons and mountings and their respective connections. The gas turbine engine itself may be any type of gas turbine engine, including, but not limited to, a turbofan (bypass) gas turbine engine, turbojet, turboprop, ramjet, scramjet or open rotor gas turbine engine, and for any application, for example aircraft, industrial, and marine application. Electrical rafts 200 and/or assemblies 600 such as any of those described and/or claimed herein may be used as part of any apparatus, such as any vehicle, including land, sea, air and space vehicles, such as motor vehicles (including cars and busses), trains, boats, submarines, aircraft (including aeroplanes and helicopters) and spacecraft (including satellites and launch vehicles).

It will be appreciated that many alternative configurations and/or arrangements of electrical rafts 200 and/or assemblies 600 and gas turbine engines 10 comprising electrical rafts 200 and/or assemblies 600 other than those described herein may fall within the scope of the invention. For example, alternative arrangements of electrical rafts 200 (for example in terms of the arrangement, including number/shape/positioning/constructions, of mounting fixtures, the arrangement/shape/positioning/construction of the electrical rafts 200, the type and/or positioning of components (if any) mounted to/embedded in the electrical rafts 200, the rigid material 220 and the electrical conductors 252) may fall within the scope of the invention and may be readily apparent to the skilled person from the disclosure provided herein. Alternative arrangements of connections (for example mechanical, electrical and/or fluid) between the electrical (or non-electrical) rafts and/or raft assemblies and between the electrical (or non-electrical) rafts or raft assemblies and other components may fall within the scope of the invention and may be readily apparent to the skilled person from the disclosure provided herein. Furthermore, any feature described and/or claimed herein may be combined with any other compatible feature described in relation to the same or another embodiment.

I claim:

1. An assembly comprising a rigid electrical raft mounted to a body, wherein:
the rigid electrical raft comprises electrical conductors embedded in a rigid material;
the rigid electrical raft is mechanically attached to the body using at least one fusible mount arrangement; and
the fusible mount arrangement is constructed and arranged to break when a predetermined mechanical load is applied to the assembly.

2. The assembly according to claim 1, wherein the fusible mount arrangement is constructed and arranged to break at a lower load than the rigid electrical raft when a load is applied through the fusible mount arrangement.

3. The assembly according to claim 1, constructed and arranged to ensure that the rigid electrical raft remains substantially undamaged when the predetermined load is applied to the assembly.

4. The assembly according to claim 1, wherein:
the rigid electrical raft is also mechanically attached to the body using at least one non-fusible mount arrangement; and
the fusible mount arrangement is constructed and arranged to break at a lower load than the non-fusible mount arrangement.

5. The assembly according to claim 4, wherein:
the non-fusible mount arrangement is constructed and arranged to remain intact above the predetermined load, such that after exposure to the predetermined load, the rigid electrical raft is mechanically attached to the body by the non-fusible mount arrangement but not by the fusible mount arrangement.

6. The assembly according to claim 1, wherein:
at least a part of the fusible mount arrangement is integral to the rigid electrical raft; and
the fusible mount arrangement is arranged to break in the part that is integral to the rigid electrical raft when the predetermined load is applied.

7. The assembly according to claim 1, wherein the fusible mount arrangement comprises a weakened portion at which the fusible mount arrangement is arranged to break when the fusible mount arrangement is subjected to the predetermined load.

8. The assembly according to claim 1, further comprising a secondary location feature constructed and arranged to constrain the movement of the rigid electrical raft relative to the body after the fusible mount arrangement has broken.

9. The assembly according to claim 1, wherein the rigid electrical raft has a fluid passage embedded therein or mounted thereon.

10. The assembly according to claim 1, wherein the rigid material of the rigid electrical raft is an organic matrix composite.

11. The assembly according to claim 1, wherein the body to which the rigid electrical raft is attached is a part of a gas turbine engine.

12. The assembly according to claim 1, wherein:
the body to which the rigid electrical raft is attached is a fan containment structure of a gas turbine engine that comprises fan blades; and
the predetermined load at which the fusible mount arrangement is constructed and arranged to break is lower than the load generated in the event of a fan blade being released from the gas turbine engine and striking the fan containment structure, and higher than the load generated in normal operation of the engine.

13. The assembly according to claim 11, wherein:
the embedded electrical conductors are a part of an electrical system of the gas turbine engine; and
the rigid electrical raft has embedded therein or mounted thereon at least one of: another part of the electrical system, and a part of another system of the gas turbine engine.

14. A gas turbine engine comprising an assembly comprising a rigid electrical raft mounted to a body, wherein:
the rigid electrical raft comprises electrical conductors embedded in a rigid material;
the rigid electrical raft is mechanically attached to the body using at least one fusible mount arrangement; and
the fusible mount arrangement is constructed and arranged to break when a predetermined mechanical load is applied to the assembly.

15. A method of assembling a gas turbine engine having a rigid electrical raft comprising electrical conductors embedded in a rigid material, the method comprising:
mechanically attaching the rigid electrical raft to a fan containment structure of the gas turbine engine using at least one fusible mount arrangement that is constructed and arranged to break when a predetermined mechanical load is applied to the fan containment structure, and at least one non-fusible mount arrangement constructed and arranged to remain intact when the predetermined load is applied to the fan containment structure, wherein:
the predetermined load is lower than the load generated in the event of a fan blade being released from the gas turbine engine and striking the fan containment structure, and higher than the load generated in normal operation of the engine, such that after the predetermined load is applied, the rigid electrical raft is mechanically attached to the fan containment structure by the at least one non-fusible mount arrangement, but not by the at least one fusible mount arrangement.

* * * * *